United States Patent [19]
Vahala et al.

[11] Patent Number: 4,929,041
[45] Date of Patent: May 29, 1990

[54] CATHODOLUMINESCENCE SYSTEM FOR USE IN A SCANNING ELECTRON MICROSCOPE INCLUDING MEANS FOR CONTROLLING OPTICAL FIBER APERTURE

[75] Inventors: Kerry J. Vahala, San Gabriel; Michael E. Hoenk, Pasadena, both of Calif.

[73] Assignee: Johnston Pump/General Valve, Inc., Brookshire, Tex.

[21] Appl. No.: 294,234

[22] Filed: Jan. 9, 1989

[51] Int. Cl.$^5$ .................. G02B 6/00; G01N 23/00
[52] U.S. Cl. .................. 350/96.10; 350/96.15; 350/96.28; 350/96.29; 250/227.29; 250/311; 250/399; 250/227.23
[58] Field of Search .............. 350/96.10, 96.15, 96.25, 350/96.26, 508, 507, 96.28, 96.29; 250/227, 311, 399

[56] References Cited

U.S. PATENT DOCUMENTS

| 4,117,323 | 9/1978 | Greer et al. | 250/311 |
| 4,211,924 | 7/1980 | Müller et al. | 250/311 |
| 4,690,493 | 9/1987 | Khoe | 350/96.20 |
| 4,700,075 | 10/1987 | Kurz et al. | 250/368 |
| 4,720,163 | 1/1988 | Goodwin et al. | 350/96.20 |

FOREIGN PATENT DOCUMENTS

| 1139457 | 1/1983 | Canada | 250/311 X |
| 2646472 | 4/1977 | Fed. Rep. of Germany | 250/311 X |
| 3030930 | 3/1982 | Fed. Rep. of Germany | 250/311 X |

OTHER PUBLICATIONS

Davidson et al., "A high-resolution cathodoluminescence analysis system" J. of Physics E: Sci. Inst. 1977 vol. 10, pp. 43-46.
Vale et al., "SEM Cathodoluminescence Detection . . ." Scanning Electron Microsopy, 1977 vol. I, IIT Research Inst. pp. 241-250.
Carlsson et al., "An efficient apparatus . . . Microscope" J. of Physcis E: Sci. Inst. 1974 vol. 7 pp. 98-100.
Muir et al., "Analytical Cathodoluminescence . . . Microscopy" Scan. Elect. Microscopy, 1974 IIT Research Inst. pp. 135-142.
Cathodoluminescence Scanning Electron Microscopy of Semiconductors by Yacobi and Holt, Journal of Applied Physics vol. 59, No. 4, Feb. 15, 1986, pp. R1 to R24.
Scanning Electron Microscopy of Biological Material Using Cathodoluminescence by E. M. Hori, Micron, 1972 3:540-544.
Scanning Transmission Electron Microscopy Techniques for Simultaneous Electronic Analysis and Observation Defects in Semiconductors by Petroff, Lang, Strudel and Logan, Scanning Electron Microscopy, 1978, vol. I, pp. 325-332.

Primary Examiner—William L. Sikes
Assistant Examiner—Brian M. Healy
Attorney, Agent, or Firm—Leonard Tachner

[57] ABSTRACT

An improved cathodoluminescence light collection system for use in electron microscopes provides an optical fiber, the facet or aperture of which is positioned adjacent the sample. The cathodoluminescence light, collected by the optical fiber in this manner, may be used to provide spectrally resolved cathodoluminescence images of the sample as well as local cathodoluminescence spectra of the type available in prior art cathodoluminescence light collection systems, but without incurring the numerous disadvantages of such prior art light collection systems. The present invention is relatively inexpensive, far easier to maintain because it does not require use of a mirror and, it is more compact in size thereby making it compatible with the physical limitations of more electron microscopes.

19 Claims, 3 Drawing Sheets

CATHODOLUMINESCENCE SYSTEM FOR USE IN A SCANNING ELECTRON MICROSCOPE INCLUDING MEANS FOR CONTROLLING OPTICAL FIBER APERTURE

ORIGIN OF INVENTION

The invention described herein was made in the performance of work under the Department of Navy Contract No. N00014-87-K-0678, and is subject to the provisions of Public Law 96-517 (35 USC 202) in which the Contractor has elected to retain title.

TECHNICAL FIELD

The present invention relates generally to cathodoluminescence which is the emission of light from a material as a result of excitation by an electron beam. More particularly, the present invention relates to a cathodoluminescence system which employs optical fiber light collection in an electron microscope.

BACKGROUND ART

When used in conjunction with the imaging capabilities of an electron microscope, cathodoluminescence is a powerful tool for analysis in a variety of different technical areas. By way of example, cathodoluminescence provides an especially powerful analysis tool in the study of semiconductors. The energy levels in semiconductor materials and insulators are affected by the concentrations of impurities, carriers and electrically active defects. Analysis of cathodoluminescence spectra enables the experimentalist to characterize and determine the effects of these and other phenomena on the cathodoluminescence emission. See for example, Cathodoluminescence Scanning Electron Microscopy of Semiconductors by Yacobi and Holt, Journal of Applied Physics, Volume 59 No. 4 February 15, 1986 pages R1 to R24.

Cathodoluminescence from biological samples originates from the material itself or from fluorescent dyes introduced for selective staining. Use of cathodoluminescence provides additional information to the electron microscopist and has wide application to plant and animal tissues. See for example, Scanning Electron Microscopy of Biological Material Using Cathodoluminescence by E. M. Horl, MICRON, 1972 3:540-544. Cathodoluminescence has a very wide range of applications in geology and minerology. The image can be affected by features such as distortions or cracks in the crystal lattice, omission defects in the crystal lattice, local crystal inhomogeneities and the presence of impurities within the lattice. For example, diamonds can be characterized from the cathodoluminescence spectra they emit and it is possible to differentiate between natural and synthetic diamonds. Cathodoluminescence also has application in the study of phosphors. Cathodoluminescence of phosphorescent materials provides valuable information relating to the efficiency of the phosphor and its microstructure.

The present invention may be used advantageously in a scanning electron microscope which generates a beam of electrons which is focused to a small spot on the sample surface. The beam is swept across an area of the sample in a raster pattern. In a conventional mode of operation, the image of the sample surface is formed by detecting the emission of secondary electrons from the sample and electronically correlating the secondary electron signal with the position of the beam. Other signals, carrying different information about the sample, can also be used for image formation. For example, back scattered electrons can be collected with a special detector to produce an image which is sensitive to variations in the material composition of the surface.

The electron beam induces a variety of excitations that result in emitted radiation. In particular, electron-hole pairs are produced in the interaction volume of the electron beam with the sample. The carriers generated by this process exist for a characteristic period of time during which they undergo intraband relaxation and diffusion/drift before recombining. Recombination can be accompanied by the emission of a photon, which is particularly likely if the sample is for example, a direct gap semiconductor. In this particular case, the photon will have an energy level close to the local band gap energy of the semiconductor. The light generated by this process, cathodoluminescence, can be used to study the local properties of the material and the results can be correlated with information from other scanning electron microscope imaging techniques.

The present invention also finds particularly advantageous application in a scanning transmission electron microscope where the emission collection system is usually constrained to a very small size. See for example, Scanning Transmission Electron Microscopy Techniques For Simultaneous Electronic Analysis and Observation of Defects In Semiconductors, by Petroff, Lang, Strudel and Logan, Scanning Electron Microscopy /1978/Vol. I, pgs. 325 to 332.

The use of cathodoluminescence light collection in electron microscopes as well as the use and analysis of spectra and images derived from cathodoluminescence light collection are not, per se, new. One example of relevant prior art known to the applicants consists of the use of a parabolic or ellipsoidal-shaped collection mirror. In the ellipsoid mirror case, one focus is centered on the area of interest of the sample while the other focus lies outside the vacuum window of the microscope column. The second focus can be aligned at the entrance to various optical components such as light guides, fiber optic bundles or a spectrometer. The mirror is usually positioned above the sample and separated therefrom by a one to three millimeter clearance. Adjustment of the mirror over the sample is usually achieved by a mechanism inside the support housing of the mirror using micrometer drives in three mutually perpendicular directions.

Unfortunately, the parabolic or ellipsoid mirror cathodoluminescence collection system of the prior art, presents a number of significant disadvantages. By way of example, one such disadvantage is the size and the clearance requirement of the mirror which make this type of system incompatible with a large number of electron microscopes. Another such disadvantage is that because the mirror is normally positioned over the sample, it is not possible to provide other forms of simultaneous electrical stimulation (such as with a probe) and signal collection (e.g., X-ray detection) thereby rendering the prior art less convenient to use and potentially less useful for analysis. Still another disadvantage of the prior art mirror collection technique of the prior art is that the mirror must be periodically removed from the scanning electron microscope and cleaned to prevent a significant reduction in light collection capability, and of course, in such required periodic cleaning is a risk of mirror surface damage which detracts from the inherent advantage of cathodoluminescence analysis.

There has therefore been a long felt need for a cathodoluminescence light collection system for use in electron microscopes which obviates the prior art requirement for large collection surfaces such as a collection mirror, while still providing the numerous advantages of cathodoluminescence analysis.

SUMMARY OF THE INVENTION

The present invention solves the aforementioned long felt need by providing a cathodoluminescence light collection system for use with electron microscopes wherein an optical fiber directly collects light from the surface of the sample. The fiber is small enough so that access to the sample by other detection systems is not restricted. Light from the sample enters the facet of the fiber which points downward toward the region of interest. The fiber guides the collected light horizontally out from under the objective lens of the scanning electron microscope and out of the chamber. The fiber is held in place by inserting it into a metal sheath made from stainless steel tubing. The sheath is mounted on a low profile support designed to allow the sample to be as close to the objective lens of the scanning electron microscope as possible. The support can be manually adjusted in three orthogonal directions to position the fiber over the sample. The optical fiber is positioned relative to the sample from the outside of the chamber with externally controlled motorized translation stages having built-in optical encoders for monitoring their motion. In the embodiment disclosed herein, three such translation stages are mounted in an orthogonal configuration which allows independent positioning of the fiber.

After being collected by the fiber and guided out of the sample chamber of the scanning electron microscope, the light is focused onto the entrance slit of a monochromator. The cathodoluminescence intensity at the selected wavelength is detected with a photomultiplier tube. The resulting signal is amplified and connected into the auxiliary input of the scanning electron microscope. The video electronics of the microscope generates a spectrally resolved cathodoluminescence image and displays it on a video monitor. A plot or graphic display of the local cathodoluminescence spectra for a selected point on the sample can also be generated as will be described hereinafter in more detail.

Unlike the mirror-type prior art, the fiber collection system disclosed herein may be conveniently cleaved, leaving a new, high optical quality collection surface, suitable for efficient collection of light. Thus, in the present invention, maintenance is far more convenient and entirely obviates the risk of damaging a collection mirror in an effort to clean its surface.

A particularly significant feature of the present invention is its minimal interference with the secondary electron signal used for obtaining images in conventional scanning electron microscopy. The secondary electron detector is usually located a few inches to one side of the sample and provides an electric field to pull electrons into the detector. It is not necessary to have line-of-sight detection with a detector of this type, but without such line-of-sight detection, such as in a collection system using a mirror, efficiency of secondary electron collection is reduced.

OBJECTS OF THE INVENTION

It is therefore a principle object of the present invention to provide an improved cathodoluminescence light collection system for use with electron microscopes.

It is an additional object of the present invention to provide an improved cathodoluminescence light collection system for use with electron microscopes and which overcomes the aforementioned deficiencies of the prior art by making it possible to provide simultaneous additional electrical stimulation of the sample and cathodoluminescence light collection while also obviating the requirement for damage-risking maintenance in the form of cleaning a critical mirror surface.

It is still an additional object of the present invention to provide an improved cathodoluminescence light collection system for use with an electron microscope in which the size and clearance requirement for the light collection system are so substantially reduced as compared to the prior art that the present invention is potentially compatible with most scanning and scanning transmission electron microscopes.

It is still an additional object of the present invention to provide an improved light collection system for cathodoluminescence analysis in an electron microscope and which uses an optical fiber for direct collection of light from the surface of the sample.

BRIEF DESCRIPTION OF THE DRAWINGS

The aforementioned objects and advantages of the present invention as well as additional objects and advantages thereof will be more fully understood hereinafter as a result of the detailed description of a preferred embodiment when taken in conjunction with the following drawings in which.

DESCRIPTION OF A PREFERRED EMBODIMENT

Figure 1:
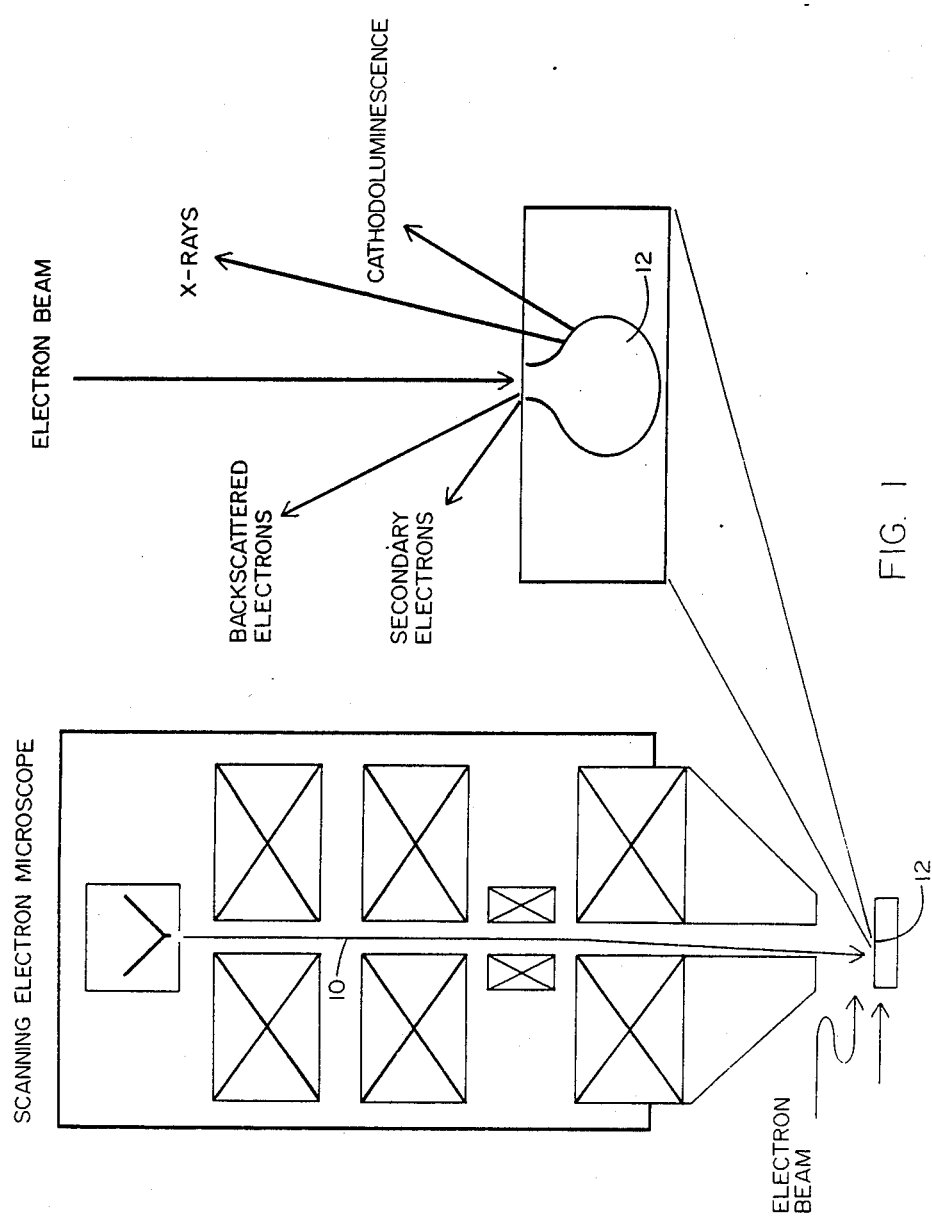
FIG. 1 is a schematic illustration of a scanning electron microscope illustrating the various types of radiations emitted by a sample bombarded by an electron beam therein.

As seen in FIG. 1, a scanning electron microscope generates a beam of electrons 10 which is focused to a small spot on the sample surface 12. The beam is swept across an area of the sample in a raster pattern. In the conventional mode of operation, the images are formed by detecting the emission of secondary electrons from the sample surface and electronically correlating the secondary electron signal with the position of the beam. Other signals, carrying different information about the sample, can also be used for image formation. For example, as seen in FIG. 1, there are also backscattered electrons which can be collected with a special detector to produce an image which is sensitive to variations in the material composition of the surface. The electron beam also produces X-rays which may be used to derive further information about the sample. However, the present invention relates to light generation induced by the interaction of the electron beam and the sample, and this light radiation is called cathodoluminescence. In particular, electron-hole pairs are produced in the interaction volume of the electron beam with the sample. The carriers generated by this process exist for a characteristic period of time, during which they undergo intraband relaxation and diffusion/drift before recombining. Recombination can be accompanied by the emission of a photon, which is particularly likely if the sample is, for example, a direct gap semiconductor. In this case, the photon will have an energy near the local band gap energy of the semiconductor. The light generated by this process can be used to study the local properties of the material and the results can be correlated with information from other scanning electron microscope imaging techniques.

Figure 2:
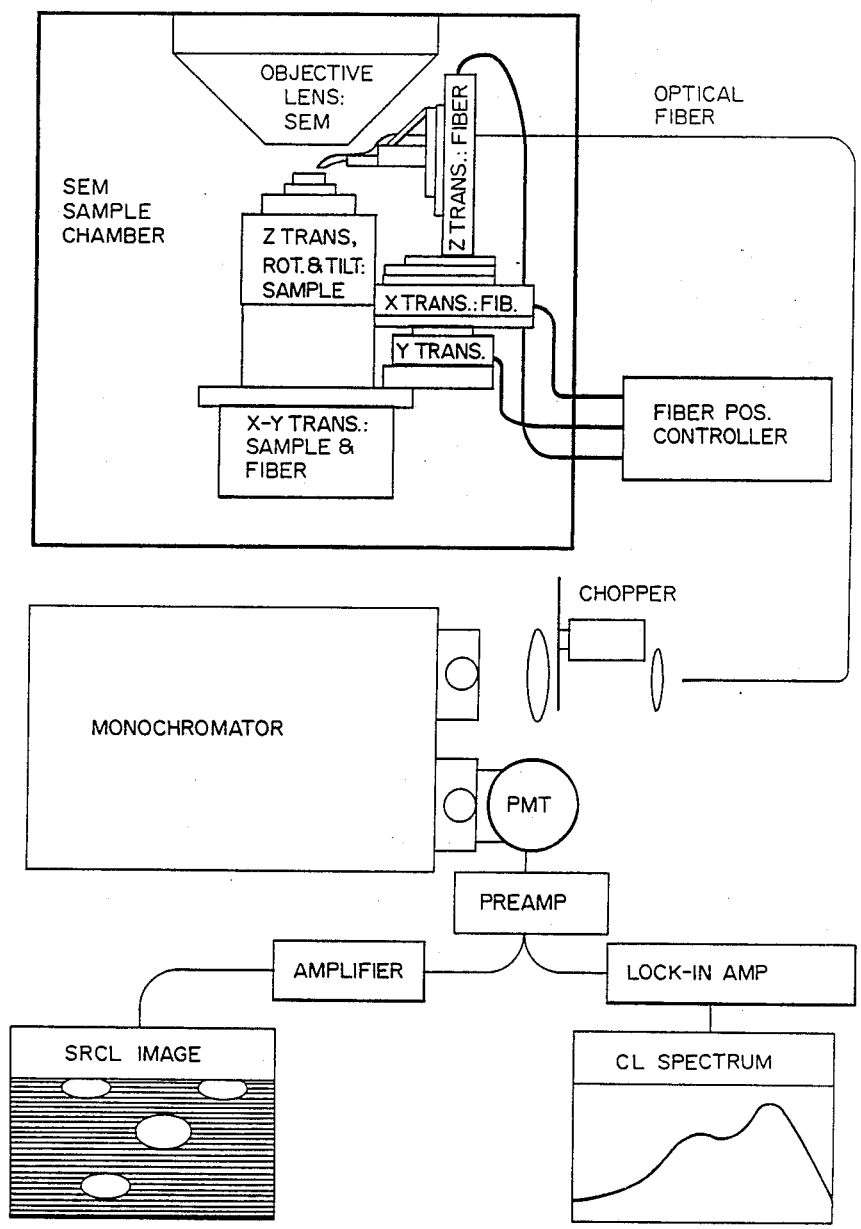
FIG. 2 is a schematic block diagram representation of a preferred embodiment of the light collection system of the present invention for use in generating spectrally resolved cathodoluminescence images and cathodoluminescence spectra.
Figure 3:
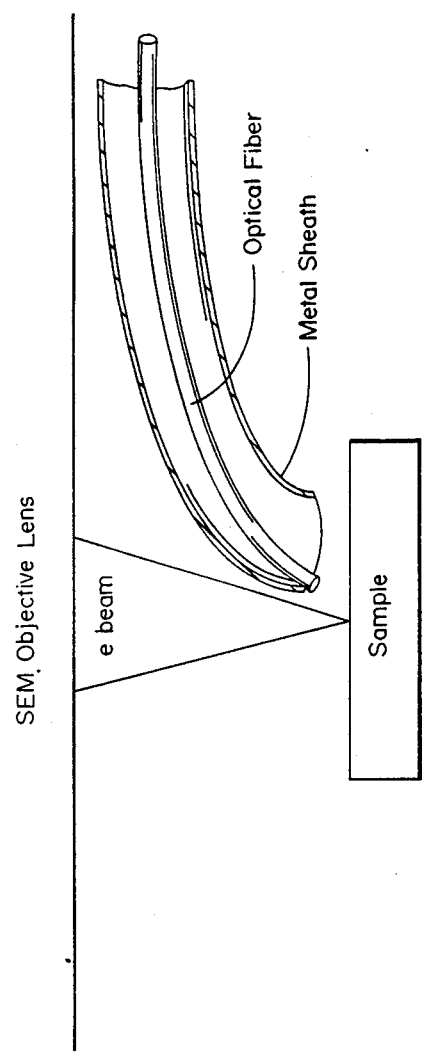
FIG. 3 is a schematic illustration of the light collecting optical fiber of the present invention shown in its light collecting position adjacent a sample in a scanning electron microscope.

The cathodoluminescence light collection system of the present invention is shown in FIG. 2. Also shown are the other portions of the system of the invention which control the position of the optical fiber within the sample chamber of the scanning electron microscope and those portions of the system which, in a preferred embodiment, may be utilized to generate a spectrally resolved image and a CL spectrum. The actual optical fiber sample interface is shown in FIG. 3. In the present invention, the optical fiber is used for direct collection of light from the surface of the sample. The fiber is sufficiently small so that access to the sample by other detection systems is not restricted. Furthermore, the dimensional and clearance restrictions of the prior art light collection mirror are significantly reduced. Light from the sample enters the facet or entrance aperture of the fiber which points downward toward the region of interest as seen in FIG. 3. The fiber guides the collected light out from under the objective lens of the scanning electron microscope and out of the chamber. In a preferred embodiment of the invention, the fiber is provided with a core diameter of 200 micrometers and has a numerical aperture of 0.2. The optimum fiber to sample distance is 0.5 millimeters. In order to prevent electrical charging of the fiber, a very thin layer of gold may be evaporated onto the facet. The fiber is held in place by inserting it into a metal sheath made from 0.01 inch wall thickness stainless steel tubing, 1/16 inch in diameter. The sheath is mounted onto a low profile support which is designed to allow the sample to be as close to the objective lens of the scanning electron microscope as possible. In the preferred embodiment of the invention shown herein, the minimum sample to objective working distance obtained was 9 millimeters.

The support can be manually adjusted in three orthogonal directions to center the fiber over the sample. After the chamber is closed, the optical fiber is positioned relative to the sample with externally controlled motorized translation stages. The stages have built-in optical encoders for monitoring their motion and are vacuum compatible. Three of these translations stages are mounted in an x, y, z configuration. In the preferred embodiment of the invention, this configuration allows independent positioning of the fiber over a 0.5 inch by 0.5 inch square area with submicron repeatability.

As seen in FIG. 2, after being collected by the fiber and guided out of the sample chamber, the light is focused onto the entrance slit of a monochromator. The cathodoluminescence intensity at the selected wavelength is detected with a photomultiplier tube (PMT). The resulting signal is amplified and connected to the auxiliary input of the scanning electron microscope. The scanning electron microscope video electronics generate the spectrally resolved cathodoluminescence image and display it on the video monitor of the scanning electron microscope. All of the image processing electronics of the scanning electron microscope are available for manipulation of the spectrally resolved cathodoluminescence image. This image can be compared directly with any of the other types of images which can be produced with this scanning electron microscope. Noise can be reduced by a combination of slowing the scan rate and using a digital image storing device to average the signal. Spectrally resolved cathodoluminescence micrographs can be taken with the video camera of the scanning electron microscope.

A useful feature of cathodoluminescence systems which incorporate a monochromator for spectral resolution of this signal, is the ability to measure local cathodoluminescence spectra. An interesting point on the sample can be selected by moving a cursor to the appropriate place on the video display of either the secondary electron image or the spectrally resolved cathodoluminescence image and changing from scan mode to spot mode. In the spot mode, the electron beam is used as a moveable probe for localized excitation of charge carriers. A mechanical light chopper is placed between the end of the fiber and the monochromator to modulate the signal. The modulated signal is connected to a current preamplifier followed by a lock-in amplifier. The lock-in amplifier filters out much of the noise generated by the photomultiplier tube by amplifying only that part of the signal which is modulated at the frequency of the light chopper. The output of the lock-in amplifier is applied to a mechanical plotter. The monochromator controller is set to scan a desired wavelength arranged in synchronism with the scan of the plotter, thus producing a plot of the local cathodoluminescence spectrum. The spectral data is collected and stored by an IBM PC AT, using an IEEE-488 data bus.

In the particular embodiment reduced to practice by the applicants herein, the cathodoluminescence light collection system of the present invention, was designed for incorporation into the sample chamber of a Cambridge model S240 scanning electron microscope. The optical fiber used for light collection was the Newport F-VCF vacuum fiber-optic feed-through with an FC-2UV multimode fiber optic cable. The fiber was mounted on a standard 2 and ¾ inch flange which was in turn mounted onto the door of the sample chamber. Manipulation of the fiber was accomplished with three Oriel miniature motorized translators with optical encoders model number 16728 designed to be vacuum compatible. The Oriel encoder controller model number 18011 is placed on the scanning electron microscope console for convenient control of the translators during operation. A Spex 0.4 meter monochromator with a 1200 groove/mm grating blazed at 750 nm was used. The position of the grating was controlled by a Spex model 1673 C mini drive 2 and a Hamamtsu model R666 photomultiplier tube was used for light detection. The resulting system mounted on a standard scanning electron microscope stage proved to be compact, inexpensive, easy to align with the sample, required little or no maintenance, provided a large wavelength range, permitted an excellent secondary electron signal and allowed sample accessibility to other detection apparatus while being fully retractable.

It will now be understood that what has been disclosed herein comprises an improved cathodoluminescence light collection system for use in electron microscopes and providing a facet or aperture of the optical fiber that is positioned adjacent the sample. In a scanning electron microscope the fiber aperture is positioned between the sample and the objective lens of the microscope. In a scanning transmission electron microscope the aperture may be positioned either above or below the sample which lies inside the objective lens of the microscope. The cathodoluminescence light collected by the optical fiber in this novel manner, may be used to provide spectrally resolved cathodoluminescence images of the sample as well as local cathodoluminescence spectra of the type available in prior art cathodoluminescence light collection systems, but without incurring the numerous disadvantages of such prior art light collection systems. More specifically, unlike the prior art noted herein, the optical fiber light collection of the present invention is far more compact, thereby requiring much smaller dimensional and clearance dimensions within the sample chamber of the scanning electron microscope. As a result, the present invention is compatible with a far greater number of electron microscopes. Furthermore, the present invention is relatively inexpensive, far easier to maintain because it does not require a mirror and, perhaps most importantly, it does not interfere with other forms of simultaneous electrical stimulation such as by a current supplying probe.

Those having skill in the art to which the present invention pertains, will now, as a result of the applicants teaching herein, perceive various modifications and additions which may be made to the invention. By way of example, while specific dimensions and types of materials used in the present invention have been disclosed herein, it will now be apparent that other dimensions and materials may also be used as long as they remain compatible with the basic underlying inventive improvement of a cathodoluminescence light collection system for use in electron microscopes as described herein. Accordingly, all such modifications and additions are deemed to be within the scope of the invention in which is to be limited only by the claims appended hereto.

We claim:

1. An improved cathodoluminescence light collection system for use in scanning electron microscopes of the type using a scanning electron beam directed through an objective lens into a sample chamber and onto a sample within the chamber; the improvement comprising:
    an optical fiber having a light entry aperture positioned between said sample and said objective lens for collecting at least a portion of the cathodoluminescence light emitted by said sample in response to said electron beam; and
    means for precisely controlling the position of said aperture relative to said sample from a location outside said chamber.

2. The improvement recited in claim 1 wherein said fiber is contained within a protective sheath along at least a portion thereof.

3. The improvement recited in claim 1 wherein said position controlling means comprises three mutually orthogonal translators within said chamber and a remote control associated with each such translator and located outside of said chamber.

4. The improvement recited in claim 1 wherein said fiber is positioned within said chamber to preclude interference with said electron beam.

5. The improvement recited in claim 1 wherein said fiber is connected to means for generating a spectrally resolved image of the cathodoluminescence light collected.

6. The improvement recited in claim 1 wherein said fiber is connected to means for generating a spectral graph of the cathodoluminescence light collected.

7. The improvement recited in claim 1 wherein said fiber has a core diameter of 200 micrometers and a numerical aperture of 0.2.

8. The improvement recited in claim 1 wherein said aperture is positioned about 0.5 millimeters from said sample.

9. The improvement recited in claim 2 wherein said protective sheath comprises about 0.01 inch wall thickness stainless steel tubing having about a 1/16 inch diameter.

10. The improvement recited in claim 1 wherein the distance between said sample and said objective lens is about 9 millimeters.

11. An improved cathodoluminescence light collection system for use in electron microscope for collecting light emitted by a sample in response to incident electrical energy within a chamber; the improvement comprising:
    an optical fiber having a light entry aperture positioned adjacent the sample; and
    means for precisely controlling the position of said aperture relative to said sample from a location outside said chamber.

12. The improvement recited in claim 11 wherein said fiber is contained within a protective sheath along at least a portion thereof.

13. The improvement recited in claim 11 wherein said position controlling means comprises three mutually orthogonal translators within said chamber and a remote control associated with each such translator and located outside of said chamber.

14. The improvement recited in claim 11 wherein said fiber is positioned within said chamber to preclude interference with said electron beam.

15. The improvement recited in claim 11 wherein said fiber is connected to means for generating a spectrally resolved image of the cathodoluminescence light collected.

16. The improvement recited in claim 11 wherein said fiber is connected to means for generating a spectral graph of the cathodoluminescence light collected.

17. The improvement recited in claim 11 wherein said fiber has a core diameter of 200 micrometers and a numerical aperture of 0.2.

18. The improvement recited in claim 11 wherein said aperture is positioned about 0.5 millimeters from said sample.

19. The improvement recited in claim 12 wherein said protective sheath comprises about 0.01 inch wall thickness stainless steel tubing having about a 1/16 inch diameter.

* * * * *